(12) United States Patent
Kurihara et al.

(10) Patent No.: US 8,734,964 B2
(45) Date of Patent: May 27, 2014

(54) ETCHING RESIST

(75) Inventors: Kazuma Kurihara, Tsukuba (JP); Takashi Nakano, Tsukuba (JP); Takayuki Shima, Tsukuba (JP); Junji Tominaga, Tsukuba (JP); Kazuya Fujioka, Ibaraki (JP); Ichiro Suehiro, Ibaraki (JP)

(73) Assignees: National Institute of Advanced Industrial Science and Technology, Tokyo (JP); Nitto Denko Corporation, Ibaraki-shi (JP)

( * ) Notice: Subject to any disclaimer, the term of this patent is extended or adjusted under 35 U.S.C. 154(b) by 524 days.

(21) Appl. No.: 12/638,349

(22) Filed: Dec. 15, 2009

(65) Prior Publication Data
US 2010/0167015 A1    Jul. 1, 2010

(30) Foreign Application Priority Data

Dec. 25, 2008 (JP) ................................ 2008-330431

(51) Int. Cl.
*B32B 3/00* (2006.01)
*C23F 1/08* (2006.01)
*C23F 1/00* (2006.01)
*C01B 21/20* (2006.01)

(52) U.S. Cl.
USPC .......................... 428/698; 428/156; 423/385

(58) Field of Classification Search
None
See application file for complete search history.

(56) References Cited

U.S. PATENT DOCUMENTS

| 6,171,973 | B1 |  | 1/2001 | Schiavone et al. |
|---|---|---|---|---|
| 6,618,200 | B2 | * | 9/2003 | Shimizu et al. ............... 359/619 |
| 7,186,392 | B2 | * | 3/2007 | Gole ............................. 423/263 |
| 7,727,902 | B2 |  | 6/2010 | Takei et al. |
| 7,771,626 | B2 | * | 8/2010 | Mikami et al. ............. 252/519.1 |
| 2004/0096617 | A1 |  | 5/2004 | Yoo et al. |
| 2005/0230752 | A1 | * | 10/2005 | Kanno et al. ................... 257/347 |
| 2006/0077560 | A1 | * | 4/2006 | Shimizu et al. ............... 359/649 |
| 2006/0234168 | A1 | * | 10/2006 | Kim et al. ..................... 430/330 |
| 2007/0026685 | A1 |  | 2/2007 | Bae et al. |
| 2007/0030776 | A1 | * | 2/2007 | Kim et al. .................... 369/47.1 |
| 2007/0099066 | A1 | * | 5/2007 | Okumura et al. ............... 429/40 |
| 2008/0050895 | A1 |  | 2/2008 | Miyairi et al. |
| 2008/0078444 | A1 | * | 4/2008 | Atanackovic ................. 136/256 |
| 2008/0121849 | A1 | * | 5/2008 | Mikami et al. ........... 252/519.12 |

(Continued)

FOREIGN PATENT DOCUMENTS

JP    64-46932    2/1989
JP    7-181688 A    7/1995

(Continued)

OTHER PUBLICATIONS

Japanese Office Action issued on Jan. 24, 2011 in corresponding Japanese Application No. 2008-330431.

(Continued)

*Primary Examiner* — Vera Katz
(74) *Attorney, Agent, or Firm* — Oblon, Spivak, McClelland, Maier & Neustadt, L.L.P.

(57) ABSTRACT

An etching resist has a first heat-generating layer, a second heat-generating layer, and a metal compound layer including a metallic oxynitride layer containing a metallic oxynitride. The first heat-generating layer, the metallic oxynitride layer, and the second heat-generating layer are directly or indirectly laminated such that the metallic oxynitride layer is positioned between the first heat-generating layer and the second heat-generating layer.

19 Claims, 2 Drawing Sheets

(56) References Cited

U.S. PATENT DOCUMENTS

| | | | |
|---|---|---|---|
| 2008/0175982 A1* | 7/2008 | Robinson et al. | 427/74 |
| 2008/0176388 A1* | 7/2008 | Carter | 438/585 |
| 2010/0051464 A1 | 3/2010 | Nakayama et al. | |
| 2012/0125773 A1 | 5/2012 | Nakayama et al. | |
| 2012/0125774 A1 | 5/2012 | Nakayama et al. | |

FOREIGN PATENT DOCUMENTS

| | | |
|---|---|---|
| JP | 2000-512079 A | 9/2000 |
| JP | 2006-216220 | 8/2006 |
| JP | 2008-73768 A | 4/2008 |
| JP | 2008-142915 A | 6/2008 |
| WO | WO 2005/064403 A1 | 7/2005 |
| WO | WO 2008/139867 | 11/2008 |

OTHER PUBLICATIONS

Office Action mailed May 3, 2012, in Chinese Patent Application No. 200910252535.7, filed Dec. 23, 2009.

* cited by examiner

ETCHING RESIST

FIELD OF THE INVENTION

The present invention relates to an etching resist. More specifically, the present invention relates to an etching resist usable in the production of a molded article for working of nanosize patterns on a surface of an optical member such as a microlens sheet, a light diffusing sheet, a non-reflective sheet, a sheet for encapsulating photosemiconductor elements, an optical waveguide, an optical disk, or a photosensor, a method for producing a molded article obtained or obtainable by using the etching resist, and a molded article obtained or obtainable by the method.

BACKGROUND OF THE INVENTION

Methods of working fine holes on a substrate surface are also applied in the working of optical members, and more high level working methods are demanded to meet the precise working of opto-electronic equipments of the recent years.

For example, Japanese Patent Laid-Open No. 2006-216220 discloses a method of forming fine holes on a substrate surface, using an etching resist worked to given patterns by irradiating a laser beam over an etching resist comprising a metal compound layer (electro-alloy layer) made of platinum oxide, silver oxide, or the like, and phase-change layers formed on both sides of the metal compound layer, thereby forming penetrating holes.

SUMMARY OF THE INVENTION

The present invention relates to:
[1] an etching resist containing a metallic oxynitride;
[2] a method for producing a molded article, including the steps of:
step A: laminating the etching resist as defined in the above item [1] over a molding material;
step B: irradiating a laser beam over the etching resist laminated in the step A to form penetrating holes in the etching resist; and
step C: etching a surface of the molding material exposed in the penetrating holes formed in the step B; and
[3] a molded article obtained or obtainable by the method as defined in the above item [2].

DETAILED DESCRIPTION OF THE INVENTION

Figure 1:
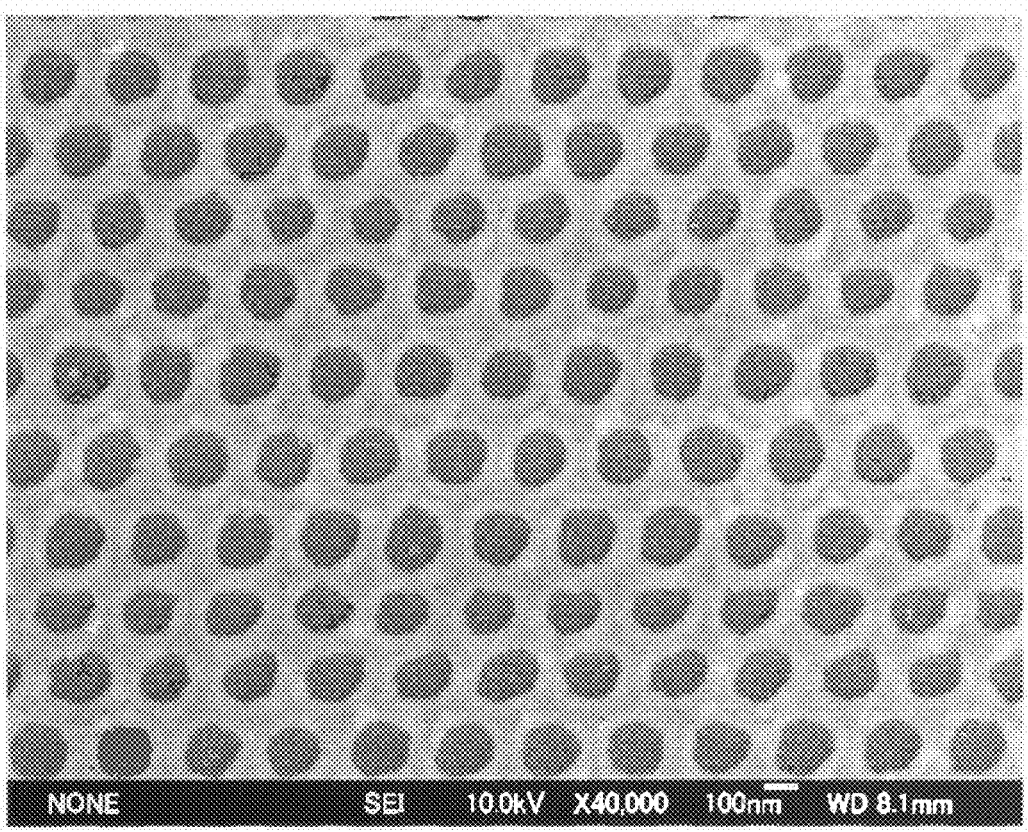
FIG. 1 is a drawing showing the shapes of penetrating holes in a case where the penetrating holes are formed by irradiating a laser beam over an etching resist of Example 1.

The method described in Japanese Patent Laid-Open No. 2006-216220 is disadvantageous in that fine metal particles having a diameter of 50 nm or so are generated in a great number by laser beam irradiation, and deposited to inner walls of penetrating holes and substrate surfaces, so that precision working cannot be performed in the working of an optical member, whereby sufficient optical properties cannot be obtained.

In view of the above, the present inventors have intensively studied on the disadvantages of the conventional methods; as a result, the present invention has been perfected. Specifically, the present invention relates to an etching resist usable in the production of a molded article for surface-working an optical member having excellent optical properties, a method for producing a molded article obtained or obtainable by using the etching resist, and a molded article obtained or obtainable by the method.

The etching resist of the present invention exhibits an effect that a molded article in which fine holes can be formed on a surface of an optical member can be produced.

These and other advantages of the present invention will be apparent from the following description.

The etching resist of the present invention has a great feature in that the etching resist contains a metallic oxynitride as a metal compound.

In an etching resist described in Japanese Patent Laid-Open No. 2006-216220, a metal oxide is used for a metal compound layer. When the metal compound layer is irradiated by a laser beam, a metal compound is degraded to a gas and a metal, thereby forming penetrating holes at the irradiated sites. During the laser beam irradiation, the generated fine metal particles are deposited on the inner walls of the penetrating holes, so that the subsequent production of the molded article is affected. On the other hand, in the present invention, a metallic oxynitride is used for a metal compound; therefore, although not wanting to limited by theory, an $N_2$ gas generated by laser beam irradiation inhibits the generation of fine metal particles, so that the deposition of the fine particles to laser beam-irradiated sites is inhibited, thereby making it possible to produce a molded article suitably fitting surface patterns of a precise optical member. Here, the term "molded article" as used herein refers to a die capable of molding an optical member by pressing a resin sheet or the like thereto, and mold-releasing the sheet.

The etching resist of the present invention is not particularly limited, so long as the etching resist contains a metallic oxynitride. One embodiment of the etching resist of the present invention includes an embodiment where an etching resist contains a metallic oxynitride layer, which is a layer made of a metallic oxynitride, and further contains a first heat-generating layer and a second heat-generating layer, wherein these layers are directly or indirectly laminated in the order of the first heat-generating layer, the metallic oxynitride layer, and the second heat-generating layer. When the etching resist comprising the above three-layer structure is irradiated, for example, with a laser beam, a structural change takes place due to an increase in temperature at the irradiated sites. Specifically, the first heat-generating layer and the second heat-generating layer are allowed to absorb the laser beam to generate heat, and the metallic oxynitride in the metallic oxynitride layer is degraded to a metal and a gas, whereby consequently penetrating holes are formed.

Either one of the first heat-generating layer and the second heat-generating layer may be contacted to a molding material during the production of a molded article, and the first heat-generating layer and the second heat-generating layer are not particularly limited so long as the layers contain a component for generating heat (also referred to herein as a heat-generating component), in which heat generation takes place due to a temperature elevation by irradiation with a laser beam.

The heat-generating component includes, for example, an AgInSbTe alloy, a GeSbTe alloy, an SbTe alloy, an InSbTe alloy, a BiSbTe alloy, a GaSbTe alloy, and the like, and these alloys can be used alone or in a combination. Also, the heat-generating component constituting the first heat-generating layer and the second heat-generating layer may be identical or different, and it is preferable that the heat-generating component is identical.

In addition, the first heat-generating layer and the second heat-generating layer may contain other components besides the above alloys, so long as heat is generated thereby. The other components include O, N, F, C, Si, and the like. The alloy in each layer is contained in an amount of preferably 60% by weight or more, more preferably 80% by weight or more, and even more preferably substantially 100% by weight.

The first heat-generating layer and the second heat-generating layer can be produced in accordance with a known method such as sputtering method, vacuum deposition method, or CVD method, and it is preferable to use sputtering method, from the viewpoint of facilitation of the compositional control of the layer. Here, as the sputtering method, a radio-frequency (RF) sputtering method using a gas of a radio frequency is preferred.

For example, in a case where a first heat-generating layer and a second heat-generating layer are made of an AgInSbTe alloy, a thin film of the above alloy can be formed by targeting an AgInSbTe alloy, and allowing an inert gas such as argon (Ar) to collide at a high speed under vacuum conditions.

The first heat-generating layer and the second heat-generating layer have a thickness of preferably from 1 to 50 nm, more preferably from 2 to 30 nm, and even more preferably from 3 to 20 nm, respectively, from the viewpoint of heat-generating property and workability. Here, in a case where the layer is formed according to a sputtering method, the thickness of the layer can be adjusted by controlling a film-forming time.

The metal compound layer in the present invention contains a metallic oxynitride layer containing a metallic oxynitride.

A metal in the metallic oxynitride is not particularly limited. It is preferable that the metal contains at least one element selected from the group consisting of Pt, Ag, Pd, and W as a main component, and it is more preferable that the metal contains Pt, from the viewpoint of working precision. The phrase "a main component of the metal" as used herein refers to a component that is contained in an amount of 80% or more, and preferably 95% or more, of the overall metal contained in the metallic oxynitride layer.

In addition, the oxygen content in the metallic oxynitride is preferably from 55 to 80 Atom %, and more preferably from 55 to 60 Atom %. Also, the nitrogen content in the metallic oxynitride is preferably from 5 to 30 Atom %, and more preferably from 20 to 30 Atom %. The atomic content (Atom %) as used herein can be measured in accordance with the method described in Examples set forth below.

In addition, the metallic oxynitride layer may contain other components besides the above metallic oxynitride, so long as the generation of the fine metallic particles due to laser beam irradiation can be inhibited. Other components include Si, F, C, and the like. The metallic oxynitride is contained in an amount of preferably 60% by weight or more, more preferably 80% by weight or more, and even more preferably substantially 100% by weight, of the metallic oxynitride layer.

It is preferable that the metallic oxynitride layer is produced by using a sputtering method in the same manner as in the first heat-generating layer and the second heat-generating layer mentioned above.

For example, in a case where a metallic oxynitride layer is made of a platinum oxynitride, a thin film of a platinum oxynitride can be formed by targeting a platinum, and allowing a mixture prepared by mixing proper amounts of an inert gas such as argon (Ar) and a reactive gas such as nitrogen or oxygen to collide at high speed under vacuum conditions. Here, the amount of nitrogen contained and the amount of oxygen contained in the resulting metallic oxynitride can be adjusted according to a flow rate of the reactive gas.

The metallic oxynitride layer has a thickness of preferably from 5 to 100 nm, more preferably from 7 to 50 nm, and even more preferably from 10 to 30 nm, from the viewpoint of working stability.

Thus, the first heat-generating layer, the metallic oxynitride layer, and the second heat-generating layer are obtained. The etching resist of the present invention is not limited in a method of lamination, so long as these layers are directly or indirectly laminated in this order. It is preferred that these layers are laminated using a sputtering method, from the viewpoint of operability. Specifically, these layers can be laminated using a sputtering method, by forming a metallic oxynitride layer on a first heat-generating layer, and further forming a second heat-generating layer thereon. Here, the etching resist that is "directly laminated" as used herein means an etching resist that is formed by directly laminating a first heat-generating layer, a metallic oxynitride layer, and a second heat-generating layer. On the other hand, the etching resist that is "indirectly laminated" as used herein means an etching resist that is formed by laminating the layers in a manner that another layer is interposed between a first heat-generating layer and a metallic oxynitride layer and/or between a metallic oxynitride layer and a second heat-generating layer in accordance with a conventional method.

The etching resist of the present invention has a thickness of preferably from 7 to 200 nm, more preferably from 10 to 100 nm, and even more preferably from 15 to 70 nm, from the viewpoint of working stability.

The etching resist of the present invention can be worked into desired patterns by laminating the layers on a molding material of a molded article, and irradiating a laser beam over the laminate, thereby forming holes (openings) penetrating through a first heat-generating layer, a metallic oxynitride layer and a second heat-generating layer. Therefore, a molding material can be subjected to an etching treatment through openings of the worked etching resist, whereby a molded article can be produced. Therefore, the present invention provides a method for producing a molded article using the etching resist of the present invention.

A preferred method for producing a molded article includes a method including the steps of:

step A: laminating an etching resist of the present invention over a molding material;

step B: irradiating a laser beam over the etching resist laminated in the step A to form penetrating holes in the etching resist; and step C: etching a surface of the molding material exposed in the penetrating holes formed in the step B.

In the step A, an etching resist of the present invention is laminated over a molding material.

The molding material includes inorganic materials such as glass, silicon, metals, and ceramics; and organic materials such as epoxy resins, polyimides, polycarbonates, and acrylic resins, and glass and silicon are preferred, from the viewpoint of working precision.

Here, in the present invention, a dielectric layer or a metallic layer made of Cr, Al, Ni or the like may be formed between a molding material and a first heat-generating layer as an auxiliary layer of the etching resist.

The dielectric layer includes those constituted by Si, SiN, $SiO_2$, carbon, or the like. The dielectric layer and the metallic layer can be produced using a sputtering method.

The dielectric layer or the metallic layer has a thickness of preferably from 5 to 500 nm, more preferably from 10 to 300 nm, and even more preferably from 30 to 150 nm, from the viewpoint of a difference in rates of etching a molding material.

A lamination method is not particularly limited, and includes the following embodiments:

Embodiment 1: a method including the step of directly laminating a separately prepared etching resist over a molding material;

Embodiment 2: a method including the step of sequentially laminating a first heat-generating layer, a metallic oxynitride layer, and a second heat-generating layer of an etching resist over a molding material.

In the present invention, the layers may be laminated according to either one of the embodiments. The embodiment 2 is preferred, from the viewpoint of operability. In a case where a dielectric layer is formed over a molding material, a dielectric layer is formed according to an RF sputtering method, and an etching resist of the present invention may then be laminated according to either one of the embodiments mentioned above.

In the step B, a laser beam is irradiated over the etching resist laminated in the above step A to form penetrating holes in the etching resist.

The laser is not particularly limited. Lasers having shorter wavelengths have higher energy, so that a laser having a wavelength, for example, of 405 nm can be suitably used. In addition, since the highest energy is obtained near the center of the laser beam-irradiated part according to a Gaussian distribution, an intensive laser may be irradiated utilizing a spot diameter.

The formed penetrating holes have a hole size of preferably from 50 to 300 nm, and more preferably from 100 to 170 nm.

Here, in a case where an etching resist or a dielectric layer remains in the formed penetrating holes, the etching resist or the dielectric layer may be removed by dry etching, wet etching or the like.

In the step C, a surface of the molding material exposed in the penetrating holes formed in the step B is etched.

As an etching method, a known method can be used. It is preferable to use a reactive ion etching (RIE) method, from the viewpoint of making a difference in the etching rates of a molding material and an etching resist larger. Here, according to the etching method, a surface of a molding material exposed in penetrating holes can be etched. In a case where a dielectric layer is present between a molding material and an etching resist, the dielectric layer and the molding material surface can be etched. In addition, when a molding material surface is etched, an etching resist can be etched, whereby a molded article can be produced.

Since the molded article thus obtained is produced by using an etching resist in which fine metal particles are not generated, a desired pattern can be precisely reproduced. Therefore, the present invention further provides a molded article obtained or obtainable by the method of the present invention. An optical member molded by the molded article of the present invention has desired surface patterns, so that the optical member has even more excellent optical properties.

Here, a molding die can be mass-produced by utilizing the molded article obtained above as a master mold, forming a metallic layer on the master mold by, for example, plating, and removing the metallic layer. The molded article of the present invention includes a master mold as mentioned above.

EXAMPLES

The following examples further describe and demonstrate embodiments of the present invention. The examples are given solely for the purposes of illustration and are not to be construed as limitations of the present invention.

Examples 1 to 3

A silicon substrate (diameter: 10.16 cm, thickness: 525 μm), a molding material, was subjected to an RF sputtering method with an RF magnetron sputtering apparatus (commercially available from SHIBAURA MECHATRONICS CORPORATION, CFS-4EP) in accordance with each of the following conditions, to laminate a dielectric layer (thickness: 100 nm) thereon, and to laminate thereon a first heat-generating layer (thickness: 5 nm), a metallic oxynitride layer (thickness: 20 nm), and a second heat-generating layer (thickness: 5 nm) of an etching resist of Examples 1 to 3, in this order. Here, the etching resists of Examples 1 to 3 had a thickness of 30 nm.

| <Dielectric Layer> | |
| --- | --- |
| Target: | Si |
| RF Power: | 200 W |
| Degree of Vacuum: | $5 \times 10^{-1}$ Pa |
| Gases (Flow Rates): | Ar (7.5 sccm), $N_2$ (2.5 sccm) |

| <First Heat-Generating Layer and Second Heat-Generating Layer> | |
| --- | --- |
| Target: | AgInSbTe Alloy |
| RF Power: | 100 W |
| Degree of Vacuum: | $5 \times 10^{-1}$ Pa |
| Gas (Flow Rate): | Ar (7.5 sccm) |

| <Metallic Oxynitride Layer> | |
| --- | --- |
| Target: | Pt |
| RF Power: | 100 W |
| Degree of Vacuum: | $5 \times 10^{-1}$ Pa |
| Gases (Flow Rates): | Listed in Table 1 |

Next, each of the etching resists was irradiated with a semiconductor laser under the following conditions to form penetrating holes, whereby the etching resist was worked into a given pattern.

| <Irradiation Conditions for Laser> | |
| --- | --- |
| Laser Wavelength: | 405 nm |
| Laser Frequency: | 12 MHz |

-continued

<Irradiation Conditions for Laser>

| | |
|---|---|
| Pitch: | 250 nm |
| Pulse Width: | 10 nsec |
| Focus Gain: | 70 |
| Focus Offset: | 60 |
| Laser Power: | 10 to 23 mW |

Comparative Example 1

The same procedures as in Example 1 were carried out, except that a metal oxide layer (thickness: 20 nm) was formed in place of the metallic oxynitride layer (thickness: 20 nm), thereby laminating an etching resist of Comparative Example 1 over a molding material. In addition, the etching resist of Comparative Example 1 was also worked with given patterns in the same manner as in Example 1. Here, the metal oxide layer was formed in accordance with an RF sputtering method under the same conditions as those in the formation of the metallic oxynitride layer in Example 1 except that the gases listed in Table 1 were used. Here, the etching resist of Comparative Example 1 had a thickness of 30 nm.

Each of the atomic compositional ratio (Atom %) of the metallic oxynitride layer in each of Examples 1 to 3 and the atomic compositional ratio (Atom %) of the metal oxide layer in Comparative Example 1 was measured for each of the etching resists obtained with an energy-dispersive X-ray diffractometer (HORIBA, Ltd.). The results are shown in Table 1.

Figure 2:
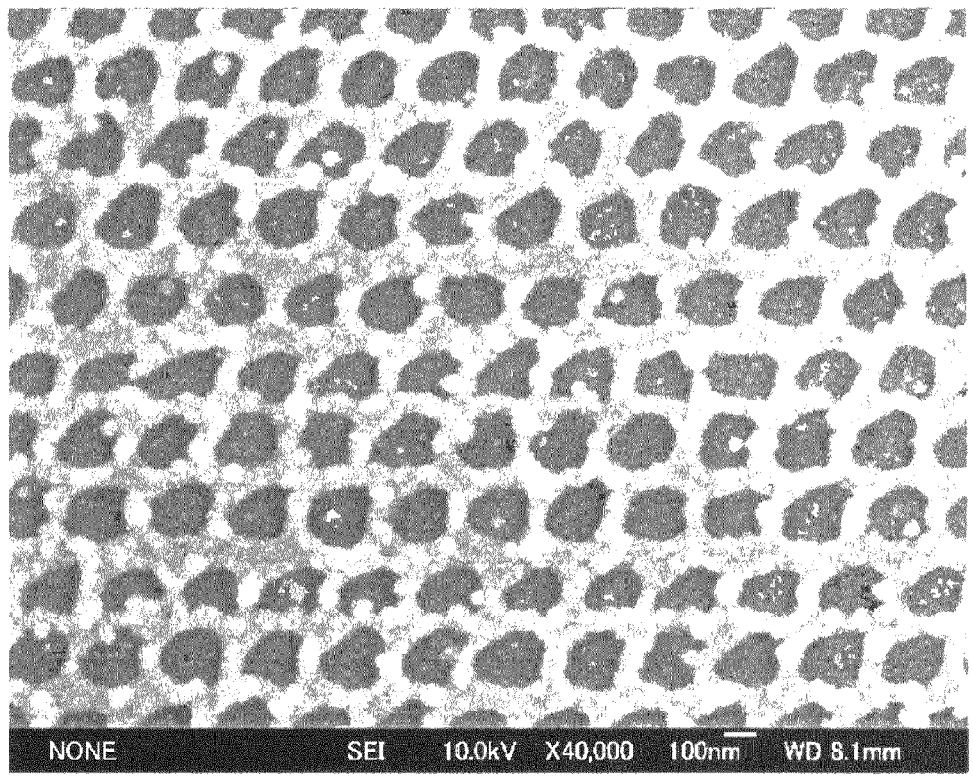
FIG. 2 is a drawing showing the shapes of penetrating holes in a case where the penetrating holes are formed by irradiating a laser beam over an etching resist of Comparative Example 1.
Figure 3:
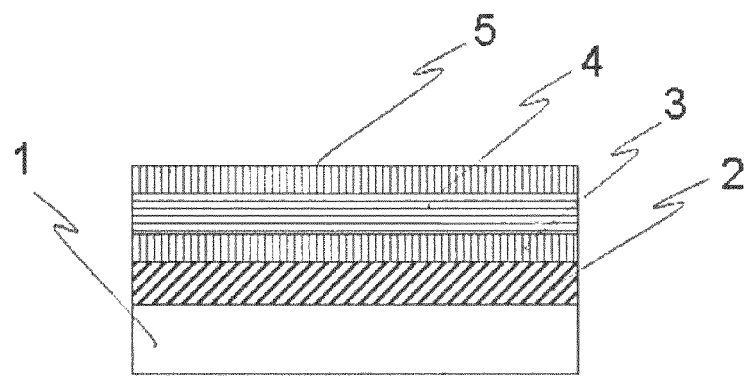
FIG. 3 is a drawing showing one example of use embodiments of an etching resist of the present invention,
wherein the numerals used are as follows: 1 is a molding material, 2 a dielectric layer, 3 a first heat-generating layer, 4 a metallic oxynitride layer, and 5 a second heat-generating layer.

The shape of the penetrating holes of the etching resist was observed with a scanning electron microscope, and the presence or absence of the fine particles was visually confirmed. The results are shown in Table 1. The shape of the penetrating holes of Example 1 is shown in FIG. 1, and the shape of the penetrating holes of Comparative Example 1 is shown in FIG. 2.

[Production of Molded Article]

The etching resist worked as mentioned above was subjected to an etching processing with a reactive ion etching (RIE) (commercially available from Semiconductor And Materials Company (SAMCO), RIE 10-NR), including the steps of etching a dielectric layer exposed in the penetrating holes of the etching resist, and further etching a molding material (silicon substrate), to surface-work the molding material, to give a molded article. The conditions for etching were as follows:

<RIE Conditions>

The following three steps (1) to (3) were carried out continuously.

(1) Gas (flow rate): Ar (60 sccm), RF power: 50 W, degree of vacuum: 1.5 Pa, time: 2 minutes (2) Gas (flow rate): CF$_4$ (60 sccm), RF power: 50 W, degree of vacuum: 1.5 Pa, time: 25 minutes (3) Gas (flow rate): Ar (60 sccm), RF power: 50 W, degree of vacuum: 1.5 Pa, time: 2 minutes The molded article obtained was observed for the state of the penetrating holes with a scanning electron microscope. The case where the etching resist and the dielectric layer disappeared, thereby giving the desired shape as designed is evaluated as "A", and the case where the shape is not as designed is evaluated as "B." The results are shown in Table 1.

[Production of Non-Reflective Sheet]

A polyethylene film was subjected to heat-and-pressure fixing (160° C., 0.5 MPa, 5 minutes) to the molded article obtained above, thereby producing a non-reflective sheet.

The reflectance at a wavelength of 555 nm was measured for the non-reflective sheet obtained with a spectrophotometer (commercially available from Hitachi High-Technologies Corporation, U-4100). The results are shown in Table 1. The lower the reflectance, the more superior the property of the non-reflective sheet.

TABLE 1

| | Ex. 1 | Ex. 2 | Ex. 3 | Comp. Ex. 1 |
|---|---|---|---|---|
| Conditions for RF Sputtering Method | | | | |
| Argon (Ar) Flow Rate (sccm) | 2.5 | 2.5 | 2.5 | 2.5 |
| Oxygen Flow Rate (sccm) | 5.5 | 3.5 | 2.5 | 7.5 |
| Nitrogen Flow Rate (sccm) | 2.0 | 4.0 | 5.0 | 0 |
| Atomic Compositional Ratio (Pt/O/N) (Atom %) | 15.2/75.2/9.6 | 14.9/60.0/25.1 | 17.0/56.4/26.6 | 14.9/85.1/0 |
| Presence or Absence of Fine Particles in Penetrating Holes | Absence | Absence | Absence | Presence |
| Shape of Molded Article | A | A | A | B |
| Reflectance of Non-Reflective Sheet (%) | 0.7 | 0.5 | 0.6 | 1.3 |

From the results of Table 1, in the molded articles using the etching resists of Examples 1 to 3, the etching resist and the dielectric layer disappeared, thereby having a precise shape in accordance with the design. On the other hand, in the molded article using the etching resist of Comparative Example 1, the shape in accordance with the design could not be obtained because of the fine metal particles deposited on the etching resist.

The non-reflective sheets containing the molded articles using the etching resists of Examples 1 to 3 had low reflectance as compared to the non-reflective sheet of Comparative Example 1.

The etching resist of the present invention can be suitably used, for example, in the production of a molded article for surface-working an optical member such as a microlens sheet, a light diffusing sheet, a non-reflective sheet, a sheet for encapsulating photosemiconductor elements, an optical waveguide, an optical disk, or a photosensor.

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An etching resist, comprising:
   a first heat-generating layer;
   a second heat-generating layer; and a metal compound layer including a metallic oxynitride layer comprising a metallic oxynitride, wherein the first heat-generating layer, the metallic oxynitride layer, and the second heat-generating layer are directly laminated such that the metallic oxynitride layer is positioned between the first heat-generating layer and the second heat-generating layer, and the metallic oxynitride contains oxygen in an amount of 55 to 80 Atom %, and nitrogen in an amount of 5 to 30 Atom %.

2. The etching resist according to claim 1, wherein the metallic oxynitride comprises at least one element selected from the group consisting of Pt, Ag, Pd, and W as a main component.

3. The etching resist according to claim 1, wherein each of the first heat-generating layer and the second heat-generating layer is made of an AgInSbTe alloy.

4. The etching resist according to claim 1, wherein each of the first heat-generating layer and the second heat-generating layer has a thickness of from 1 to 50 nm.

5. The etching resist according to claim 1, wherein the metallic oxynitride layer has a thickness of from 5 to 100 nm.

6. The etching resist according to claim 1, wherein the metallic oxynitride comprises Pt as a main component.

7. The etching resist according to claim 1, wherein the first heat-generating layer, the second heat-generating layer and the metallic oxynitride layer form a laminate structure having a thickness of from 10 to 100 nm.

8. The etching resist according to claim 1, wherein the first heat-generating layer, the second heat-generating layer and the metallic oxynitride layer form a laminate structure having a thickness of from 7 to 200 nm.

9. The etching resist according to claim 1, wherein the metallic oxynitride layer has penetrating openings through which a molding material is subjected to an etching treatment.

10. The etching resist according to claim 1, wherein the metallic oxynitride layer has penetrating openings through which an etching treatment is applied.

11. The etching resist according to claim 1, wherein each of the first heat-generating layer and the second heat-generating layer is made of an AgInSbTe alloy and has a thickness of 2 to 30 nm.

12. The etching resist according to claim 1, wherein each of the first heat-generating layer and the second heat-generating layer has a thickness of from 3 to 20 nm.

13. The etching resist according to claim 1, wherein the metallic oxynitride layer has a thickness of from 10 to 30 nm.

14. An etching resist, comprising:
a first heat-generating layer;
a second heat-generating layer; and
a metal compound layer including a metallic oxynitride layer comprising a metallic oxynitride,
wherein the first heat-generating layer, the metallic oxynitride layer, and the second heat-generating layer are directly laminated such that the metallic oxynitride layer is positioned between the first heat-generating layer and the second heat-generating layer, and the metallic oxynitride comprises Pt as a main component.

15. The etching resist according to claim 14, wherein the first heat-generating layer, the second heat-generating layer and the metallic oxynitride layer form a laminate structure having a thickness of from 10 to 100 nm.

16. The etching resist according to claim 14, wherein the first heat-generating layer, the second heat-generating layer and the metallic oxynitride layer form a laminate structure having a thickness of from 7 to 200 nm.

17. The etching resist according to claim 14, wherein each of the first heat-generating layer and the second heat-generating layer is made of an AgInSbTe alloy.

18. The etching resist according to claim 14, wherein each of the first heat-generating layer and the second heat-generating layer has a thickness of from 3 to 20 mn.

19. The etching resist according to claim 14, wherein the first heat-generating layer, the second heat-generating layer and the metallic oxynitride layer form a laminate structure having a thickness of from 15 to 70 nm.

* * * * *